United States Patent
Schulze et al.

(10) Patent No.: US 12,029,117 B2
(45) Date of Patent: Jul. 2, 2024

(54) ORGANIC ELECTROLUMINESCENT DEVICE AND A SOLID COMPOSITION FOR USE THEREIN

(71) Applicant: Novaled GmbH, Dresden (DE)

(72) Inventors: Benjamin Schulze, Dresden (DE); Volodymyr Senkovskyy, Dresden (DE); Francois Cardinali, Dresden (DE); Pierre Seidenglanz, Dresden (DE); Ulrich Denker, Dresden (DE); Stefan Zott, Dresden (DE)

(73) Assignee: Novaled GmbH, Dresden (DE)

( * ) Notice: Subject to any disclaimer, the term of this patent is extended or adjusted under 35 U.S.C. 154(b) by 621 days.

(21) Appl. No.: 17/413,678

(22) PCT Filed: Dec. 16, 2019

(86) PCT No.: PCT/EP2019/085281
§ 371 (c)(1),
(2) Date: Jun. 14, 2021

(87) PCT Pub. No.: WO2020/120793
PCT Pub. Date: Jun. 18, 2020

(65) Prior Publication Data
US 2022/0037595 A1  Feb. 3, 2022

(30) Foreign Application Priority Data
Dec. 14, 2018  (DE) .......... 102018132280.1

(51) Int. Cl.
*H10K 50/11*  (2023.01)
*H10K 85/60*  (2023.01)
(Continued)

(52) U.S. Cl.
CPC ......... *H10K 85/654* (2023.02); *H10K 85/622* (2023.02); *H10K 50/11* (2023.02);
(Continued)

(58) Field of Classification Search
None
See application file for complete search history.

(56) References Cited

U.S. PATENT DOCUMENTS

2010/0213443 A1* 8/2010 Sapochak .......... H10K 85/6576
                                                          257/40
2016/0336516 A1* 11/2016 Zöllner ................ H10K 85/657
(Continued)

FOREIGN PATENT DOCUMENTS

EP       3208861 A1    8/2017
KR    20150000357 A    1/2015
(Continued)

OTHER PUBLICATIONS

Notification of First Office Action issued in Chinese application No. 201980081945.1, dated Jan. 26, 2024 (16 pages).
(Continued)

*Primary Examiner* — Robert S Loewe
(74) *Attorney, Agent, or Firm* — Eversheds Sutherland (US) LLP

(57) ABSTRACT

Organic electroluminescent device comprising an anode, a cathode, at least one emission layer and an organic semi-conducting layer; wherein the organic semiconducting layer is arranged between the at least one emission layer and the cathode; wherein the organic semiconducting layer comprises; a) a first organic compound comprising a first $C_{10}$ to $C_{42}$ arene structural moiety and/or a first $C_2$ to $C_{42}$ heteroarene structural moiety, wherein i) the dipole moment of the first organic compound, computed by the TURBOMOLE V6.5 program package using hybrid functional B3LYP and Gaussian 6-31G* basis set, is from 0 to 2.5 Debye; and ii) the LUMO energy level of the first organic compound in the absolute scale taking vacuum energy level as zero, computed by the TURBOMOLE V6.5 program package using hybrid functional B3LYP and Gaussian 6-31G* basis set, is in the
(Continued)

range from −1.7 eV to −2.1 eV; and b) a second organic compound comprising a second $C_{10}$ to $C_{42}$ arene structural moiety and/or a second $C_2$ to $C_{42}$ heteroarene structural moiety and in addition at least one polar group selected from phosphine oxide and phosphine sulfide, wherein in) the dipole moment of the second organic compound, computed by the TURBOMOLE V6.5 program package using hybrid functional B3LYP and Gaussian 6-31G* basis set, is from 1.5 to 10 Debye; and iv) the LUMO energy level of the second organic compound in the absolute scale taking vacuum energy level as zero is less than 0.25 eV higher or lower than the LUMO energy level of the first organic compound; wherein it is provided that the first organic compound and the second organic compound are different from each other.

20 Claims, 2 Drawing Sheets

(51) Int. Cl.
    *H10K 101/10*    (2023.01)
    *H10K 101/30*    (2023.01)
    *H10K 101/40*    (2023.01)
(52) U.S. Cl.
    CPC ..... *H10K 2101/10* (2023.02); *H10K 2101/30* (2023.02); *H10K 2101/40* (2023.02)

(56) References Cited

U.S. PATENT DOCUMENTS

| | | | |
|---|---|---|---|
| 2017/0373255 A1* | 12/2017 | Lee | C07D 251/24 |
| 2018/0162890 A1* | 6/2018 | Cardinali | H10K 85/60 |
| 2019/0036032 A1* | 1/2019 | Denker | H10K 50/828 |
| 2019/0058123 A1* | 2/2019 | Pavicic | H10K 85/6572 |
| 2019/0252622 A1* | 8/2019 | Kim | H10K 50/82 |
| 2019/0326518 A1* | 10/2019 | Lui | C07D 405/14 |
| 2020/0095269 A1* | 3/2020 | Luschtinetz | C07F 9/5765 |
| 2020/0407383 A1* | 12/2020 | Dai | H10K 85/657 |

FOREIGN PATENT DOCUMENTS

| | | |
|---|---|---|
| WO | 2017140780 A1 | 8/2017 |
| WO | 2018/215355 A1 | 11/2018 |

OTHER PUBLICATIONS

Notice of Reasons for Refusal issued in Japan application No. 2021-533224, dated Aug. 8, 2023, 5 pages.

PCT International Search Report and Written Opinion for PCT Application No. PCT/EP2019/085281 mailed Mar. 31, 2020 (9 pages).

* cited by examiner

US 12,029,117 B2

ORGANIC ELECTROLUMINESCENT DEVICE AND A SOLID COMPOSITION FOR USE THEREIN

CROSS REFERENCE TO RELATED APPLICATIONS

This application is a U.S. national phase application of PCT/EP2019/085281, filed Dec. 16, 2019, which claims priority to German Application No. 10 2018 132 280.1, filed Dec. 14, 2018. The content of these applications is incorporated herein by reference.

The present invention relates to an organic electroluminescent device and to a solid composition for use therein.

BACKGROUND ART

Organic light-emitting diodes (OLEDs), which are self-emitting devices, have a wide viewing angle, excellent contrast, quick response, high brightness, excellent driving voltage characteristics, and color reproduction. A typical OLED includes an anode, a hole transport layer (HTL), an emission layer (EML), an electron transport layer (ETL), and a cathode, which are sequentially stacked on a substrate. In this regard, the HTL, the EML, and the ETL are thin films formed essentially by organic and/or organometallic compounds.

When a voltage is applied to the anode and the cathode, holes injected from the anode electrode move to the EML, via the HTL, and electrons injected from the cathode electrode move to the EML, via the ETL. The holes and electrons mainly recombine in the EML to generate excitons. When the excitons drop from an excited state to a ground state, light is emitted. The injection and flow of holes and electrons should be balanced, so that an OLED having the above-described structure has excellent efficiency.

Due to concerns about technical complexity of mass production tools comprising more than one evaporation source and especially about process robustness and reliable process control which are decisive in mass production but might be difficult in such complex tools, there has been a strong focus on organic electron transport materials comprising an one-component matrix. Consequently, the focus in material design has been on implementing all important functionalities required for a matrix material into one organic compound, with a molecular weight limited by volatility and thermal stability of such compounds.

However, there is still a need to provide novel materials for preparing organic electroluminescent devices enabling broader freedom of design of the electroluminescent device and/or for improving the electronic properties thereof.

It is, therefore, the object of the present invention to provide organic electroluminescent devices and materials for use therein overcoming drawbacks of the prior art, in particular providing alternative and/or improved electron transport matrix materials, which might enable broader freedom of design for electroluminescent devices comprising an organic electron injection and/or electron transport layer.

SUMMARY OF THE INVENTION

The object is first of all achieved by an organic electroluminescent device comprising an anode, a cathode, at least one emission layer and an organic semiconducting layer; wherein the organic semiconducting layer is arranged between the at least one emission layer and the cathode;
wherein the organic semiconducting layer comprises:
a) a first organic compound comprising a $C_{10}$ to $C_{42}$ arene structural moiety and/or a $C_2$ to $C_{42}$ heteroarene structural moiety, wherein
  i) the dipole moment of the first organic compound is from 0 to 2.5 Debye; and
  ii) the LUMO of the first organic compound is from −1.7 eV to −2.1 eV; and
b) a second organic compound comprising a $C_{10}$ to $C_{42}$ arene structural moiety and/or a $C_2$ to $C_{42}$ heteroarene structural moiety and in addition at least one polar group selected from phosphine oxide and phosphine sulfide, wherein
  iii) the dipole moment of the second organic compound is from 1.5 to 10 Debye; and
  iv) the LUMO of the second organic compound is less than 0.25 eV higher or lower than the LUMO of the first organic compound;
wherein it is provided that the first organic compound and the second organic compound are different from each other.

The inventors surprisingly found that some combinations of two or more compounds which each individually have their molar weights and respective volatilities in the range suitable for processing by vacuum thermal evaporation (VTE) in state-of-art mass production tools enable design of versatile organic semiconducting layers, such as election transport layers, with improved properties which may not be easily achieved by current approach based on design of a single matrix compound.

In terms of the present invention, two organic compounds are different form each other if they are different in their chemical composition and/or structure. In other words, mixtures of molecules having the same structure and differing only in the isotopic ratio of the comprised elements would be considered as the same compound. Likewise, tautomers, rotamers, etc. not differing in their composition and/or structure from each other shall be considered as being the same.

Both the dipole moment and the LUMO energy level of the inventive compounds are determined by computing by TURBOMOLE quantum chemical package using B3LYP functional and G-31* basis set.

The first organic compound and the second organic compound may only comprise atoms selected from the group consisting of C, H, B, Si, Ge, O, N, P, S, F and I. In this way, it is possible to further improve the properties of the organic semiconducting layer.

The organic semiconducting layer may further comprise an electrical n-dopant. In this way, it is possible to further improve the properties of the organic semiconducting layer.

The n-dopant may be a metal salt comprising at least one metal cation and at least one anion. In this way, it is possible to further improve the properties of the organic semiconducting layer.

The metal cation of the metal salt may be selected from the group consisting of alkali metals, alkaline earth metals, and rare earth metals, alternatively from the group consisting of Li, Na, K, Rb, Cs, Mg, Ca, Sr, and Ba; alternatively from Li, Mg, Ca, and Sr. In this way, it is possible to further improve the properties of the organic semiconducting layer.

The anion of the metal salt may be selected from the group consisting of quinolinolate, phosphine oxide phenolate and borate. In this way, it is possible to further improve the properties of the organic semiconducting layer.

The weight ratio of the first organic compound to the second organic compound may be from 99:1 to 1:99, alternatively from 19:1 to 1:19, alternatively from 9:1 to 1:9, alternatively from 4:1 to 1:4, alternatively from 3:1 to 1:3, alternatively from 2:1 to 1:2, most preferably from 2:3 to 3:2. In this way, it is possible to further improve the properties of the organic semiconducting layer.

The molar weight of the first organic compound and the second organic compound may be, respectively, from 300 to 3000 g/mol, alternatively from 350 to 2500 g/mol, alternatively from 400 to 2000 g/mol, alternatively from 450 to 1500 g/mol, alternatively from 500 to 1000 g/mol. In this way, it is possible to further improve the properties of the organic semiconducting layer.

In one embodiment, the first and the second organic compound may be molecularly dispersed in each other. It is to be understood that "molecularly dispersed" means that the size of domains comprising the first organic compound and/or domains comprising solely the second organic compound does not exceed 1 nm.

In one of possible embodiments, the semiconducting layer is optically homogeneous. It is to be understood that the optically homogeneous layer does not contain spatial domains which could be distinguished from each other in terms of chemical composition and/or physico-chemical properties or such domains do not exceed in any direction the size 1 micrometer.

In one of possible embodiments, the semiconducting layer is substantially homogeneous. It is to be understood that the substantially homogeneous layer does not contain spatial domains which could be distinguished from each other in terms of chemical composition and/or physico-chemical properties or such domains do not exceed in any direction the size 10 nanometer. Preferably, such domains do not exceed in any direction the size 7 nm, more preferably the size 5 nm, even more preferably the size 4 nm, even more preferably the size 3 nm, most preferably the size 2 nm.

In another possible embodiment, the semiconducting layer is chemically isotropic. It is to be understood that in the chemically isotropic layer, concentration of any component of the layer does not exhibit systematic change in any chosen direction.

In another possible embodiment, the semiconducting layer is substantially isotropic. It is to be understood that in the substantially isotropic layer, neither concentration of any component nor physico-chemical property of the layer do exhibit systematic change in any chosen direction.

In the first organic compound
a) the polar group may be phosphine oxide; and/or
b) the $C_{10}$ to $C_{42}$ arene structural moiety and/or the $C_2$ to $C_{42}$ heteroarene structural moiety may comprise at least two, alternatively at least three, alternatively at least four fused aromatic rings. In this way, it is possible to further improve the properties of the organic semiconducting layer.

The $C_{10}$ to $C_{42}$ arene structural moiety and/or the $C_2$ to $C_{42}$ heteroarene structural moiety comprised in the second organic compound may comprise at least two, alternatively at least three, alternatively at least four fused aromatic rings. In this way, it is possible to further improve the properties of the organic semiconducting layer.

The dipole moment of the first organic compound may be from 0 to 2.0 Debye, alternatively from 0 to 1.5 Debye, alternatively from 0 to 1.0 Debye, alternatively from 0 to 0.5 Debye. In this way, it is possible to further improve the properties of the organic semiconducting layer.

The dipole moment of the first organic compound may be lower than the dipole moment of the second organic compound, preferably an absolute value of the difference between the LUMO of the first organic compound and the LUMO of the second organic compound may be at least 0.1 Debye, alternatively at least 0.2 Debye, alternatively at least 0.3 Debye, alternatively at least 0.5 Debye, alternatively at least 1.0 Debye, alternatively at least 1.5 Debye, alternatively at least 2.0 Debye, alternatively at least 2.5 Debye, alternatively at least 3.0 Debye, alternatively at least 3-5 Debye, alternatively at least 4.0 Debye. In this way, it is possible to farther improve the properties of the organic semiconducting layer.

An absolute value of the difference between the LUMO of the first organic compound and the LUMO of the second organic compound may be lower than 0.23 eV, alternatively lower than 0.20 eV, alternatively lower than 0.17 eV, alternatively lower than 0.15 eV, alternatively lower than 0.12 eV, alternatively lower than 0.09 eV. In this way, it is possible to further improve the properties of the organic semiconducting layer.

The dipole moment of the first organic compound may be from 0 to 2.0 Debye and the dipole moment of the second organic compound may be from 2.0 to 10 Debye; alternatively, the dipole moment of the first organic compound may be from 0 to 1.5 Debye and the dipole moment of the second organic compound may be from 1.5 to 10 Debye; alternatively, the dipole moment of the first organic compound may be from 0 to 2.5 Debye and the dipole moment of the second organic compound may be from 2.5 to 10 Debye; alternatively, the dipole moment of the first organic compound may be from 0 to 1.5 Debye and the dipole moment of the second organic compound may be from 2.0 to 10 Debye; alternatively, the dipole moment of the first organic compound may be from 0 to 1.0 Debye and the dipole moment of the second organic compound may be from 1.5 to 10 Debye; alternatively, the dipole moment of the first organic compound may be from 0 to 1.0 Debye and the dipole moment of the second organic compound may be from 2.0 to 10 Debye; alternatively, the dipole moment of the first organic compound may be from 0 to 1.5 Debye and the dipole moment of the second organic compound may be from 2.5 to 10 Debye; alternatively, the dipole moment of the first organic compound may be from 0 to 1.5 Debye and the dipole moment of the second organic compound may be from 3.0 to 10 Debye; alternatively, the dipole moment of the first organic compound may be from 0 to 1.0 Debye and the dipole moment of the second organic compound may be from 2.5 to 10 Debye; alternatively, the dipole moment of the first organic compound may be from 0 to 1.0 Debye and the dipole moment of the second organic compound may be from 3.0 to 10 Debye; alternatively, the dipole moment of the first organic compound may be from 0 to 0.5 Debye and the dipole moment of the second organic compound may be from 1.5 to 10 Debye; alternatively, the dipole moment of the first organic compound may be from 0 to 0.5 Debye and the dipole moment of the second organic compound may be from 2.0 to 10 Debye; alternatively, the dipole moment of the first organic compound may be from 0 to 0.5 Debye and the dipole moment of the second organic compound may be from 2.5 to 10 Debye; alternatively, the dipole moment of the first organic compound may be from 0 to 0.5 Debye and the dipole moment of the second organic compound may be from 3.0 to 10 Debye, alternatively, the dipole moment of the first organic compound may be from 0 to 0.5 Debye and the dipole moment of the second organic compound may be from 3.5 to 10 Debye; alternatively, the dipole moment of the first organic compound may be from 0 to 0.5 Debye and the dipole moment of the second organic compound may be from 4.0 to 10 Debye. In this way, it is possible to further improve the properties of the organic semiconducting layer.

An exemplary organic semiconducting layer according to invention may comprise compounds E1 and E2

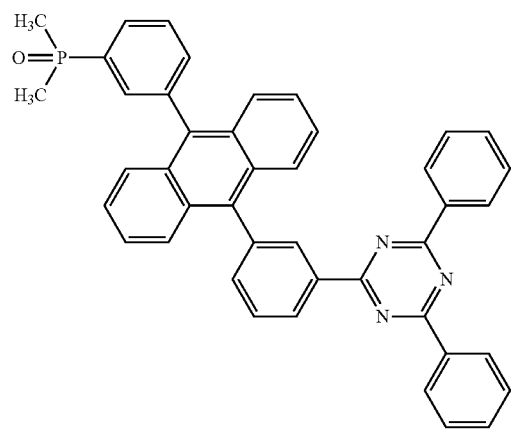

E1

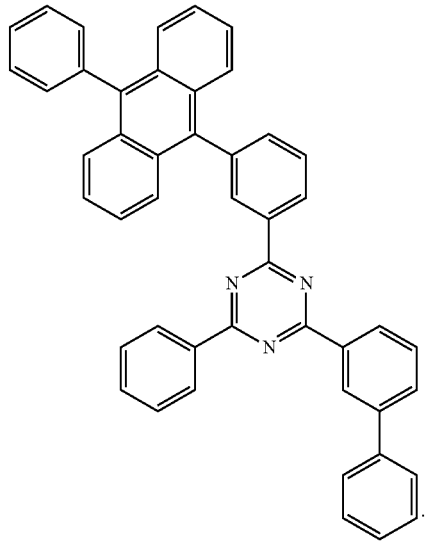

E2

Compound E1 is disclosed in the application WO2018/215355 and has a gas phase dipole moment, computed by the TURBOMOLE V6.5 (supplier TURBOMOLE GmbH, Litzenhardtstrasse 19, 76135 Karlsruhe, Germany) program package using hybrid functional B3LYP and Gaussian 6-31G* basis set, 4.47 Debye, and LUMO energy level, computed by the same program package, −1.90 eV.

Compound E2 is disclosed in detail in experimental part below and has a gas phase dipole moment, computed by the TURBOMOLE V6.5 program package using hybrid functional B3LYP and Gaussian 6-31G* basis set, 0.37 Debye, and LUMO energy level, computed by the same program package, −1.84 eV.

Another example of the organic semiconducting layer according to the invention may be a layer consisting of compounds E3 and E4

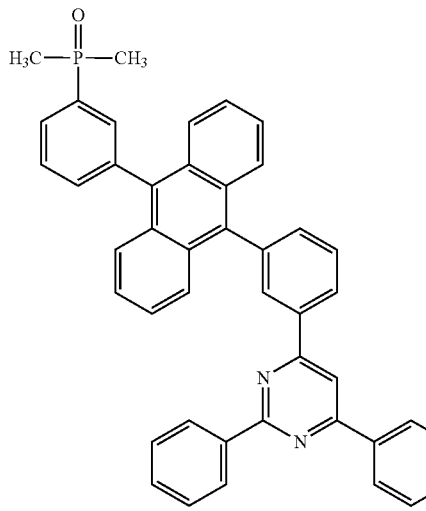

E3

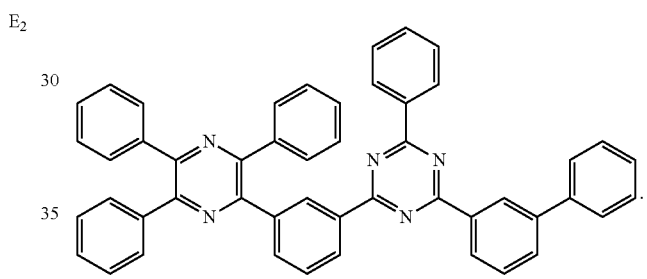

E4

Compound E3 has a gas phase dipole moment, computed by the TURBOMOLE V6.5 program package using hybrid functional B3LYP and Gaussian 6-31G* basis set, 2.59 Debye, and LUMO energy level, computed by the same program package, −1.86 eV.

Compound E4 has a gas phase dipole moment, computed by the TURBOMOLE V6.5 program package using hybrid functional B3LYP and Gaussian 6-31G* basis set, 0.40 Debye, and LUMO energy level, computed by the same program package, −1.85 eV.

Still another option for the second and first compound, respectively, do represent compounds E5 and E6

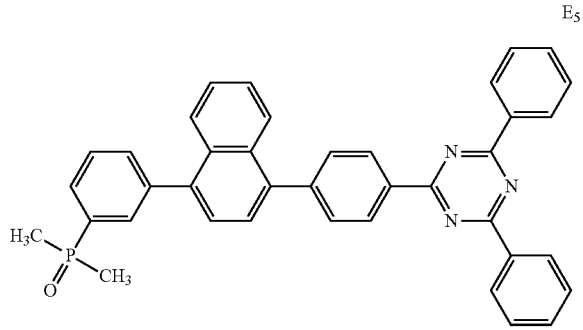

E5

-continued

E6

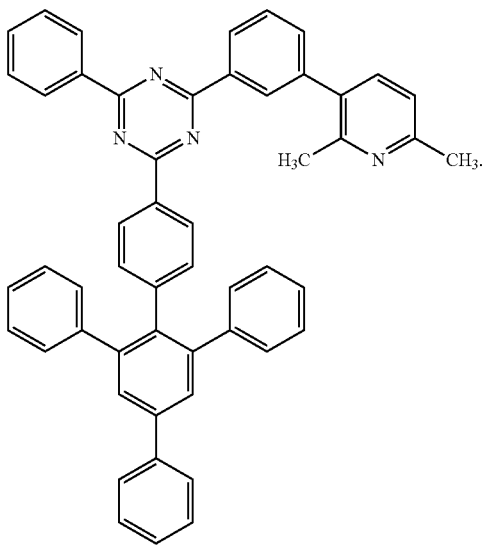

Compound E5 is disclosed in WO2018/215355, has a gas phase dipole moment, computed by the TURBOMOLE V6.5 program package using hybrid functional B3LYP and Gaussian 6-31G* basis set, 4.27 Debye, and LUMO energy level, computed by the same program package, −1.97 eV.

Compound E6 has a gas phase dipole moment, competed by the TURBOMOLE V6.5 program package using hybrid functional B3LYP and Gaussian 6-31G* basis set, 1.61 Debye, and LUMO energy level, computed by the same program package, −1.86 eV.

Finally, the object is farther achieved by compound E3.

Further Layers

In accordance with the invention, the organic electroluminescent device may comprise, besides the layers already mentioned above, farther layers. Exemplary embodiments of respective layers are described in the following:

Substrate

The substrate may be any substrate that is commonly used in manufacturing of, electronic devices, such as organic light-emitting diodes. If light is to be emitted through the substrate, the substrate shall be a transparent or semitransparent material, for example a glass substrate or a transparent plastic substrate. If light is to be emitted through the top surface, the substrate may be both a transparent as well as a non-transparent material, for example a glass substrate, a plastic substrate, a metal substrate or a silicon substrate.

Anode Electrode

Either a first electrode or a second electrode comprised in the inventive organic electroluminescent device may be an anode electrode. The anode electrode may be formed by depositing or sputtering a material that is used to form the anode electrode.

The material used to form the anode electrode may be a high work-function material, so as to facilitate hole injection. The anode material may also be selected from a low work function material (i.e. aluminum). The anode electrode may be a transparent or reflective electrode. Transparent conductive oxides, such, as indium tin oxide (ITO), indium zinc oxide (IZO), tin-dioxide (SnO2), aluminum zinc oxide (AlZO) and zinc oxide (ZnO), may be used to form the anode electrode. The anode electrode may also be formed using metals, typically silver (Ag), gold (An), or metal alloys.

Hole Injection Layer

A hole injection layer (HIL) may be formed on the anode electrode by vacuum deposition, spin coating, printing, casting, slot-die coating, Langmuir-Blodgett (LB) deposition, or the like. When the HIL is formed using vacuum deposition, the deposition conditions may vary according to the compound that is used to form the HIL, and the desired structure and thermal properties of the HIL. In general, however, conditions for vacuum deposition may include a deposition temperature of 100° C. to 500° C., a pressure of 10-8 to 10-3 Torr (1 Torr equals 133.322 Pa), and a deposition rate of 0.1 to 10 nm/sec.

When the HIL is formed using spin coating or printing, coating conditions may vary according to the compound that is used to form the HIL, and the desired structure and thermal properties of the HIL. For example, the coating conditions may include a coating speed of about 2000 rpm to about 5000 rpm, and a thermal treatment temperature of about 80° C. to about 200° C. Thermal treatment removes a solvent after the coating is performed.

The HIL may be formed of any compound that is commonly used to form a HIL. Examples of compounds that may be used to form the HIL include a phthalocyanine compound, such as copper phthalocyanine (CuPc), 4,4',4"-tris (3-methylphenylphenylamino) triphenylamine (m-MTDATA), TDATA, 2T-NATA, polyaniline/dodecylbenzenesulfonic acid (Pani/DBSA), poly(3,4-ethylenedioxythiophene)/poly(4-styrenesulfonate) (PEDOT/PSS), polyaniline/camphor sulfonic acid (Pani/CSA), and polyaniline)/poly(4-styrenesulfonate (PANI/PSS).

The HIL may comprise, or consist of, a p-type dopant and the p-type dopant may be selected from tetrafluoro-teftracyanoquinonedimethane (F4TCNQ), 2,2'-(perfluoronaphthalen-2,6-diylidene) dimalononitrile or 2,2',2"-(cyclopropane-1,2,3-triylidene)tris(2-(p-cyanotetrafluorophenyl) acetonitrile) but not limited hereto. The HIL may be selected from a hole-transporting matrix compound doped with a p-type dopant. Typical examples of known doped hole transport materials are: copper phthalocyanine (CuPc), which HOMO level is approximately −5.2 eV, doped with tetrafluoro-tetracyanoquinonedimethane (F4TCNQ), which LUMO level is about −5.2 eV; zinc phthalocyanine (ZnPc) (HOMO=−5.2 eV) doped with F4TCNQ; α-NPD (N,N'-Bis (naphthalen-1-yl)-N,N-bis(phenyl)-benzidine) doped with F4TCNQ. α-NPD doped with 2,2'-(perfluoronaphthalen-2, 6-diylidene) dimalononitrile. The p-type dopant concentrations may be selected from 1 to 20 wt-%, more preferably from 3 wt.-% to 10 wt.-%.

The thickness of the HIL may be in the range from about 1 nm to about 100 nm, and for example, from about 1 nm to about 25 nm. When the thickness of the HIL is within this range, the HIL may have excellent hole injecting characteristics, without a substantial penalty in driving voltage.

Hole Transport Layer

A hole transport layer (HTL) may be formed on the HIL by vacuum deposition, spin coating, slot-die coating, printing, casting, Langmuir-Blodgett (LB) deposition, or the like. When the HTL is formed by vacuum deposition or spin coating, the conditions for deposition and coating may be similar to those for the formation of the HIL. However, the conditions for the vacuum or solution deposition may wry, according to the compound that is used to form the HTL.

The HTL may be formed of any compound that is commonly used to form a HTL. Compounds that can be suitably used are disclosed for example in Yasuhiko Shirota and Hiroshi Kageyama, Chem. Rev. 2007, 107, 953-1010 and incorporated by reference. Examples of the compound that may be used to form the HTL are: carbazole derivatives, such as N-phenylcarbazole or polyvinylcarbazole; benzidine derivatives, such as N,N'-bis(3-methylphenyl)-N,N'-diphenyl-[1,1-biphenyl]-4,4-diamine (TPD), or N,N'-di(naphthalen-1-yl)-N,N'-diphenyl benzidine (alpha-NPD); and triphenylamine-based compound, such as 4,4',4"-tris(N-carbazolyl)triphenylamine (TCTA). Among these compounds, TCTA can transport holes and inhibit excitons from being diffused into the EML.

The thickness of the HTL may be in the range of about 5 nm to about 250 nm, preferably, about 10 nm to about 200 nm, farther about 20 nm to about 190 nm, further about 40 nm to about 180 nm, further about 60 nm to about 170 nm, farther about 80 nm to about 160 nm, further about 100 nm to about 160 nm, farther about 120 nm to about 140 nm.

When the thickness of the HTL is within this range, the HTL may have excellent hole transporting characteristics, without a substantial penalty in driving voltage.

Electron Blocking Layer

The function of an electron blocking layer (EBL) is to prevent electrons from being transferred from an emission layer to the hole transport layer and thereby confine electrons to the emission layer. Thereby, efficiency, operating voltage and/or lifetime are improved. Typically, the electron blocking layer comprises a triarylamine compound. The triarylamine compound may have a LUMO level closer to vacuum level than the LUMO level of the hole transport layer. The electron blocking layer may have a HOMO level that is further away from vacuum level compared to the HOMO level of the hole transport layer. The thickness of the electron blocking layer may be selected between 2 and 20 nm.

If the electron blocking layer has a high triplet level, it may also be described as triplet control layer.

The function of the triplet control layer is to reduce quenching of triplets if a phosphorescent green or blue emission layer is used. Thereby, higher efficiency of light emission from a phosphorescent emission layer can be achieved. The triplet control layer is selected from compounds with a triplet level above the triplet level of the phosphorescent emitter in the adjacent emission layer. Suitable compounds for the triplet control layer, in particular the triarylamine compounds, are described in EP 2 722 908 A1.

Emission Layer (EML)

The EML may be formed on the HTL by vacuum deposition, spin coating, slot-die coating, printing, casting, LB deposition, or the like. When the EML is formed using vacuum deposition or spin coating, the conditions for deposition and coating may be similar to those for the formation of the ML. However, the conditions for deposition and coating may vary, according to the compound that is used to form the EML.

The EML may be formed of a combination of host materials and emitter dopants. The EML may comprise a single host material or a plurality of host materials. The EML may comprise a single emitter dopant or a plurality of emitter dopants. Examples of the host materials are Alq3, 4,4'-N,N'-dicarbazole-biphenyl (CBP), poly(n-vinylcarbazole) (PVK), 9,10-di(naphthalene-2-yl)anthracene (ADN), 4,4',4"-tris(carbazol-9-yl)-triphenylamine (TCTA), 1,3,5-tris(N-phenylbenzimidazole-2-yl)benzene (TPBI), 3-tert-butyl-9,10-di-2-naphthylanthracenee (TBADN), distyrylarylene (DSA) and bis(2-(2-hydroxyphenyl)benzo-thiazolate) zinc (Zn(BTZ)2).

In case the EML comprises a plurality of host materials to form a host mixture the amount of each host material in the mixture of host materials may vary between 0.01 and 99.99 parts by weight.

The emitter dopant may be a phosphorescent or fluorescent emitter. Phosphorescent emitters and emitters which emit light via a thermally activated delayed fluorescence (TADF) mechanism may be preferred due to their higher efficiency. The emitter may be a small molecule or a polymer.

Examples of red emitter dopants are PtOEP, Ir(piq)3, and Btp2lr(acac), but are not limited thereto. These compounds are phosphorescent emitters, however, fluorescent red emitter dopants could also be used.

Examples of phosphorescent green emitter dopants are Ir(ppy)3 (ppy=phenylpyridine), Ir(ppy)2(acac), Ir(mpyp)3.

Examples of phosphorescent blue emitter dopants are F2Irpic, (F2ppy)2Ir(tmd) and Ir(dfppz)3 and ter-fluorene. 4.4'-bis(4-diphenyl amiostyryl)biphenyl (DPAVBi), 2,5,8,11-tetra-tert-butyl perylene (TBPe) are examples of fluorescent blue emitter dopants.

The amount of the emitter dopant may be in the range from about 0.01 to about 50 parts by weight, based on 100 parts by weight of the host or host mixture. Alternatively, the emission layer may consist of a light-emitting polymer. The EML may have a thickness of about 10 nm to about 100 nm, for example, from about 20 nm to about 60 run. When the thickness of the EML is within this range, the EML may have excellent light emission, without a substantial penalty in driving voltage.

Hole Blocking Layer (HBL)

A hole blocking layer (HBL) may be formed on the EML, by using vacuum deposition, spin coating, slot-die coating, printing, casting, LB deposition, or the like, in order to prevent the diffusion of holes into the ETL. When the EML comprises a phosphorescent dopant, the HBL may have also a triplet exciton blocking function.

The HBL may be the layer (or one of several layers) comprising the compound of formula (I).

The HBL may also be named auxiliary ETL or a-ETL.

When the HBL is formed using vacuum deposition or spin coating, the conditions for deposition and coating may be similar to those for the formation of the HIL. However, the conditions for deposition and coating may vary, according to the compound that is used to form the HBL. Any compound that is commonly used to form a HBL may be used. Examples of compounds for forming the HBL include oxadiazole derivatives, triazine derivatives, triazole derivatives, and phenanthroline derivatives.

The HBL may have a thickness in the range from about 5 nm to about 100 nm, for example, from about 10 nm to about 30 nm. When the thickness of the HBL is within this range, the HBL may have excellent hole-blocking properties, without a substantial penalty in driving voltage.

Electron Transport Layer (ETL)

The OLED according to the present invention may comprise an electron transport layer (ETL). In accordance with the invention, the electron transport layer may be the inventive organic semiconducting layer comprising the inventive compound represented by the general Formula (I) as defined above.

According to various embodiments the OLED may comprise an electron transport layer or an electron transport layer stack comprising at least a first electron transport layer and at least a second electron transport layer.

By suitably adjusting energy levels of particular layers of the ETL, the injection and transport of the electrons may be controlled, and the holes may be efficiently blocked. Thus, the OLED may have long lifetime.

The electron transport layer of the organic electroluminescent device may be the organic semiconducting layer comprising the first organic compound and the second organic compound as defined herein. The electron transport layer may comprise further ETM materials known in the art. Likewise, the electron transport layer may comprise as the only material the first organic compound and the second organic compound. In case that the inventive organic electroluminescent device comprises more than one electron transport layers, the first organic compound and the second organic compound may be comprised in only one of the electron transport layers, in more than one of the electron transport layers or in all of the electron transport layers. In accordance with the invention, the electron transport layer may comprise, besides the above ETM material, at least one additive as defined herein.

Further, the electron transport layer may comprise one or more n-type dopants. The additive may be an n-type dopant. The additive can be alkali metal, alkali metal compound, alkaline earth metal, alkaline earth metal compound, transition metal, transition metal compound or a rare earth metal. In another embodiment, the metal can be one selected from a group consisting of Li, Na, K, Rb, Cs, Mg, Ca, Sr, Ba, La, Ce, Sm, Eu, Tb, Dy, and Yb. In another embodiment, the n-type dopant can be one selected from a group consisting of Cs, K, Rb, Mg, Na, Ca, Sr, Eu and Yb. In an embodiment, the alkali metal compound may be 8-hydroxyquinolinolato-lithium (LiQ), Lithium tetra(1H-pyrazol-1-yl)borate or lithium 2-(diphenylphosphoryl)phenolate. Suitable compounds for the ETM (which may be used in addition to the inventive combination of the first organic compound and the second organic compound as defined above) are not particularly limited. In one embodiment, the electron transport matrix compounds consist of covalently bound atoms. Preferably, the electron transport matrix compound comprises a conjugated system of at least 6, more preferably of at least to delocalized electrons. In one embodiment, the conjugated system of delocalized electrons may be comprised in aromatic or heteroaromatic structural moieties, as disclosed e.g. in documents EP1970 371 A1 or WO 2013/079217 A1.

Electron Injection Layer (EIL)

An optional EIL, which may facilitates injection of electrons from the cathode, may be formed on the ETL, preferably directly on the electron transport layer. Examples of materials for forming the EIL include lithium 8-hydroxyquinolinolate (LiQ), LiF, NaCl, CsF, Li2O, BaO, Ca, Ba, Yb, Mg which are known in the art. Deposition and coating conditions for forming the EIL are similar to those for formation of the HIL, although the deposition and coating conditions may vary, according to the material that is used to form the EIL. The EIL may be the organic semiconducting layer comprising the first organic compound and the second organic compound.

The thickness of the EIL may be in the range from about 0.1 nm to about 10 nm, for example, in the range from about 0.5 nm to about 9 ran. When the thickness of the EIL is within this range, the EIL may have satisfactory electron-injecting properties, without a substantial penalty in driving voltage.

Cathode Electrode

The cathode electrode is formed on the EIL, if present. The cathode electrode may be formed of a metal, an alloy, an electrically conductive compound, or a mixture thereof. The cathode electrode may have a low work function. For example, the cathode electrode may be formed of lithium (Li), magnesium (Mg), aluminum (Al), aluminum (Al)-lithium (Li), calcium (Ca), barium (Ba), ytterbium (Yb), magnesium (Mg)-indium (In), magnesium (Mg)-silver (Ag), or the like. Alternatively, the cathode electrode may be formed of a transparent conductive oxide, such as ITO or IZO.

The thickness of the cathode electrode may be in the range from about 5 nm to about 1000 nm, for example, in the range from about 10 nm to about 100 nm. When the thickness of the cathode electrode is in the range from about 5 nm to about 50 nm, the cathode electrode may be transparent or semitransparent even if formed by a metal or metal alloy.

It is to be understood that the cathode electrode is not part of an electron injection layer or the electron transport layer.

Charge Generation Layer

The charge generation layer (CGL) may comprise a p-type and an n-type layer. An interlayer may be arranged between the p-type layer and the n-type layer.

Typically, the charge generation layer is a pn junction joining an n-type charge generation layer (electron generating layer) and a hole generating layer. The n-side of the pn junction generates electrons and injects them into the layer which is adjacent in the direction to the anode. Analogously, the p-side of the p-n junction generates holes and injects them into the layer which is adjacent in the direction to the cathode.

Charge generating layers may be used in tandem devices, for example, in tandem OLEDs comprising, between two electrodes, two or more emission layers. In a tandem OLED comprising two emission layers, the n-type charge generation layer provides electrons for the first light emission layer arranged near the anode, while the hole generating layer provides holes to the second light emission layer arranged between the first emission layer and the cathode.

Suitable matrix materials for the hole generating layer may be materials conventionally used as hole injection and/or hole transport matrix materials. Also, p-type dopant used for the hole generating layer can employ conventional materials. For example, the p-type dopant can be one selected from a group consisting of tetrafluore-7,7,8,8-tetracyanoquinodimethane (F4-TCNQ), derivatives of tetracyanoquinodimethane, radialene derivatives, iodine, FeCl3, FeF3, and SbCl5. Also, the host can be one selected from a group consisting of N,N'-di(naphthalen-1-yl)-N,N-diphenyl-benzidine (NPB), N,N'-diphenyl-N,N'-bis(3-methylphenyl)-1,1-biphenyl-4,4'-diamine (TPD) and N,N',N'-tetranaphthyl-benzidine (TNR). The p-type charge generation layer may consist of CNHAT.

The n-type charge generating layer may be the organic semiconducting layer comprising the first organic compound and the second organic compound. The n-type charge generation layer can be layer of a neat n-type dopant, for example of an electropositive metal, or can consist of an organic matrix material doped with the n-type dopant. In one embodiment, the n-type dopant can be alkali metal, alkali metal compound, alkaline earth metal, alkaline earth metal compound, a transition metal, a transition metal compound or a rare earth metal. In another embodiment, the metal can be one selected from a group consisting of Li, Na, K, Rb, Cs, Mg, Ca, Sr, Ba, La, Ce, Sm, Eu, Tb, Dy, and Yb. More specifically, the n-type dopant can be one selected from a group consisting of Cs, K, Rb, Mg, Na, Ca, Sr, Eu and Yb. Suitable matrix materials for the electron generating layer may be the materials conventionally used as matrix materials for electron injection or electron transport layers. The matrix material can be for example one selected from a group consisting of triazine compounds, hydroxyquinoline derivatives like tris(8-hydroxyquinoline)aluminum, benzazole derivatives, and silole derivatives.

The hole generating layer is arranged in direct contact to the n-type charge generation layer.

Organic Light-Emitting Diode (OLED)

According to one aspect of the present invention, there is provided an organic light-emitting diode (=organic electroluminescent device; OLED) comprising: a substrate; an anode electrode formed on the substrate; a hole injection layer, a hole transport layer, an emission layer, an organic semiconducting layer comprising the first organic compound and the second organic compound or consisting of the first organic compound and the second organic compound and a cathode electrode.

According to another aspect of the present invention, there is provided an OLED comprising: a substrate; an anode electrode formed on the substrate; a hole injection layer, a hole transport layer, an electron blocking layer, an emission layer, a hole blocking layer, an organic semiconducting layer comprising the first organic compound and the second organic compound or consisting of the first organic compound and the second organic compound and a cathode electrode.

According to another aspect of the present invention, there is provided an OLED comprising: a substrate; an anode electrode formed on the substrate; a hole injection layer, a hole transport layer, an electron blocking layer, an emission layer, a hole blocking layer, an organic semiconducting layer comprising the first organic compound and the second organic compound or consisting of the first organic compound and the second organic compound, an electron injection layer, and a cathode electrode.

According to various embodiments of the present invention, there may be provided OLEDs layers arranged between the above mentioned layers, on the substrate or on the top electrode.

According to one aspect, the OLED can comprise a layer structure of a substrate that is adjacently arranged to an anode electrode, the anode electrode is adjacently arranged to a first hole injection layer, the first hole injection layer is adjacently arranged to a first hole transport layer, the first hole transport layer is adjacently arranged to a first electron blocking layer, the first electron blocking layer is adjacently arranged to a first emission layer, the first emission layer is adjacently arranged to a first electron transport layer, the first electron transport layer is adjacently arranged to an n-type charge generation layer, the n-type charge generation layer is adjacently arranged to a hole generating layer, the hole generating layer is adjacently arranged to a second hole transport layer, the second hole transport layer is adjacently arranged to a second electron blocking layer, the second electron blocking layer is adjacently arranged to a second emission layer, between the second emission layer and the cathode electrode an optional electron transport layer and/or an optional injection layer are arranged.

The organic semiconducting layer according to the invention may be an emission layer, a hole blocking layer, an electron transport layer, a first electron transport layer, an n-type charge generation layer and/or a second election transport layer.

For example, the OLED (10) according to FIG. 2 may be formed by a process, wherein on a substrate (110), an anode (120), a hole injection layer (130), a hole transport layer (140), an electron blocking layer (145), an emission layer (150), a hole blocking layer (155), an electron transport layer (160), an electron injection layer (180) and the cathode electrode (190) are subsequently formed in that order.

Organic Electronic Device

An organic electronic device according to the invention comprises an organic semiconducting layer comprising the first organic compound and the second organic compound or consisting of the first organic compound and the second organic compound.

An organic electronic device according to one embodiment may include a substrate, an anode layer, an organic semiconducting layer comprising the first organic compound and the second organic compound or consisting of the first organic compound and the second organic compound.

An organic electronic device according to one embodiment comprises at least one organic semiconducting layer the first organic compound and the second organic compound or consisting of the first organic compound and the second organic compound, at least one anode layer, at least one cathode layer and at least one emission layer, wherein the organic semiconducting layer is preferably arranged between the emission layer and the cathode layer.

An organic light-emitting diode (OLED) according to the invention may include an anode, a hole transport layer (HTL), an emission layer (EML), an electron transport layer (ETL) the first organic compound and the second organic compound or consisting of the first organic compound and the second organic compound, and a cathode, which are sequentially stacked on a substrate. In this regard, the HTL, the EML, and the ETL are thin films formed from organic compounds.

According to another aspect of the present invention, there is provided a method of manufacturing an organic electronic device, the method using:
at least one deposition source, preferably two deposition sources and more preferred at least three deposition sources.

The methods for deposition that can be suitable comprise:
deposition via vacuum thermal evaporation;
deposition via solution processing, preferably the processing is selected from spin-coating, printing, casting; and/or
slot-die coating.

According to various embodiments of the present invention, the method may further include forming on the anode electrode, an emission layer and at least one layer selected from the group consisting of forming a hole injection layer, forming a hole transport layer, or forming a hole blocking layer, between the anode electrode and the first electron transport layer.

According to various embodiments of the present invention, the method may further include the steps for forming an organic tight-emitting diode (OLED), wherein
on a substrate a first anode electrode is formed,
on the first anode electrode an emission layer is formed,
on the emission layer an electron transport layer stack is formed, optionally a hole blocking layer is formed on the emission layer and an organic semiconducting layer is formed,
and finally a cathode electrode is formed,
optional a hole injection layer, a hole transport layer, and a hole blocking layer, formed in that order between the first anode electrode and the emission layer,
optional an electron injection layer is formed between the organic semiconducting layer and the cathode electrode.

According to various embodiments of the present invention, the method may farther comprise forming an electron injection layer on the organic semiconducting layer. However, according to various embodiments of the OLED of the present invention, the OLED may not comprise an electron injection layer.

According to various embodiments, the OLED may have the following layer structure, wherein the layers having the following order;

anode, hole injection layer, first hole transport layer, second hole transport layer, emission layer, optional hole blocking layer, organic semiconducting layer the first organic compound and the second organic compound or consisting of the first organic compound and the second organic compound, optional electron injection layer, and cathode, or anode, hole injection layer, first hole transport layer, second hole transport layer, organic semiconducting layer the first organic compound and the second organic compound or consisting of the first organic compound and the second organic compound, optional hole blocking layer, first electron transport layer, optional electron injection layer, and cathode, or anode, hole injection layer, first hole transport layer, second hole transport layer, emission layer, organic semiconducting layer the first organic compound and the second organic compound or consisting of the first organic compound and the second organic compound, first electron transport layer, optional electron injection layer, and cathode.

According to another aspect of the invention, it is provided an electronic device comprising at least one organic light emitting device according to any embodiment described throughout this application, preferably, the electronic device comprises the organic light emitting diode in one of embodiments described throughout this application. More preferably, the electronic device is a display device.

In one embodiment, the organic electronic device according to the invention comprising an organic semiconducting layer the first organic compound and the second organic compound or consisting of the first organic compound and the second organic compound may further comprise a layer comprising a radialene compound and/or a quinodimethane compound.

In one embodiment, the radialene compound and/or the quinodimethane compound may be substituted with one or more halogen atoms and/or with one or more electron withdrawing groups. Electron withdrawing groups can be selected from nitrile groups, halogenated alkyl groups, alternatively from perhalogenated alkyl groups, alternatively from perfluorinated alkyl groups. Other examples of electron withdrawing groups may be acyl, sulfonyl groups or phosphoryl groups.

Alternatively, acyl groups, sulfonyl groups and/or phosphoryl groups may comprise halogenated and/or perhalogenated hydrocarbyl. In one embodiment, the perhalogenated hydrocarbyl may be a perfluorinated hydrocarbyl. Examples of a perfluorinated hydrocarbyl can be perfluormethyl, perfluorethyl, perfluorpropyl, perfluorisopropyl, perfluorobutyl, perfluorophenyl, perfluorotolyl; examples of sulfonyl groups comprising a halogenated hydrocarbyl may be trifluoromethylsulfonyl, pentafluoroethylsulfonyl, pentafluorophenylsulfonyl, heptafluoropropylsufonyl, nonafluorobutylsulfonyl, and like.

In one embodiment, the radialene and/or the quinodimethane compound may be comprised in a hole injection, hole transporting and/or a hole generation layer.

In one embodiment, the radialene compound may have Formula (XX) and/or the quinodimethane compound may have Formula (XXIa) or (XXIb):

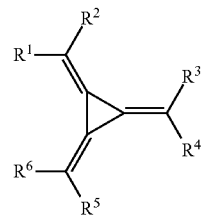

(XX)

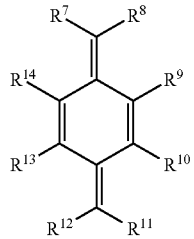

(XXIa)

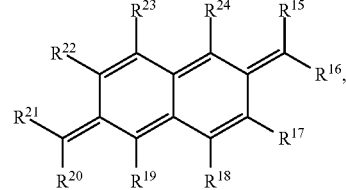

(XXIb)

wherein $R^1$, $R^2$, $R^3$, $R^4$, $R^5$, $R^6$, $R^7$, $R^8$, $R^{11}$, $R^{12}$, $R^{15}$, $R^{16}$, $R^{20}$, $R^{21}$ are independently selected from above mentioned electron withdrawing groups and $R^9$, $R^{10}$, $R^{13}$, $R^{14}$, $R^{17}$, $R^{18}$, $R^{19}$, $R^{22}$, $R^{23}$ and $R^{24}$ are independently selected from H, halogen and above mentioned electron withdrawing groups.

Hereinafter, the embodiments are illustrated in more detail with reference to examples. However, the present disclosure is not limited to the following examples. Reference will now be made in detail to the exemplary aspects.

DETAILS AND DEFINITIONS OF THE INVENTION

In terms of the present invention an organic compound is a chemical compound that contains carbon except such carbon containing compounds, such as carbonates, cyanides, carbon dioxide etc. which are generally referred to in the art as inorganic compounds.

The term phosphine oxide in terms of the present invention refers to a group having the general formula $P(=O)R_2$ with R being alkyl or aryl, such as $C_1$ to $C_{10}$ alkyl, such as methyl or $C_6$ to $C_{24}$ aryl, such as $C_6$ aryl. Analogously, the term phosphine sulfide refers to a group having the formula $P(=S)R$ with R being defined as in case of the phosphine oxide.

In the present specification, when a definition is not otherwise provided, an "alkyl group" may refer to an aliphatic hydrocarbon group. The alkyl group may refer to "a saturated alkyl group" without any double bond or triple bond. The term "alkyl" as used herein shall encompass linear as well as branched and cyclic alkyl. For example, $C_3$-alkyl may be selected from n-propyl and iso-propyl. Likewise, $C_4$-alkyl encompasses n-butyl, sec-butyl and t-butyl. Likewise, $C_6$-alkyl encompasses n-hexyl and cyclohexyl.

The subscribed number n in $C_n$ relates to the total number of carbon atoms in the respective alkyl, arylene, heteroarylene or aryl group.

The term "aryl", "arylene" or "arene" as used herein shall encompass phenyl ($C_6$-aryl), fused aromatics, such as naphthalene, anthracene, phenanthracene, tetracene etc. Further encompassed are biphenyl and oligo- or polyphenyls, such as terphenyl etc. Further encompassed shall be any further aromatic hydrocarbon substituents, such as fluorenyl etc. "Arylene" respectively "heteroarylene", refers to groups to which two further moieties are attached. In the present specification the term "aryl group" or "arylene group" may refer to a group comprising at least one hydrocarbon aromatic moiety, and all the elements of the hydrocarbon aromatic moiety may have p-orbitals which form conjugation, for example a phenyl group, a naphtyl group, an anthracenyl group, a phenanthrenyl group, a pyrenyl group, a fluorenyl group and the like. The aryl or arylene group may include a monocyclic or fused ring polycyclic (i.e., rings sharing adjacent pairs of carbon atoms) functional group.

The term "heteroaryl" or "heteroarene" as used herein refers to aryl groups in which at least one carbon atom is substituted with a heteroatom, preferably selected from N, O, S, B or Si.

The subscripted number n in $C_n$-heteroaryl merely refers to the number of carbon atoms excluding the number of heteroatoms. In this context, it is clear that a $C_3$ heteroarylene group is an aromatic compound comprising three carbon atoms, such as pyrazol, imidazole, oxazole, thiazole and the like.

The term "heteroaryl" may refer to aromatic heterocycles with at least one heteroatom, and all the elements of the hydrocarbon heteroaromatic moiety may have p-orbitals which form conjugation. The heteroatom may be selected from N, O, S, B, Si, P, Se, preferably from N, O and S. A heteroarylene ring may comprise at least 1 to 3 heteroatoms. Preferably a heteroarylene ring may comprise at least 1 to 3 heteroatoms individually selected from N, S and/or O.

The term "heteroaryl" as used herewith shall encompass pyridine, quinoline, quinazoline, pyridine, triazine, benzimidazole, benzothiazole, benzo[4,5]thieno[3,2-d]pyrimidine, carbazole, xanthene, phenoxazine, benzoacridine, dibenzoacridine and the like.

In the present specification, the single bond refers to a direct bond.

The term "fluorinated" as used herein refers to a hydrocarbon group in which at least one of the hydrogen atoms comprised in the hydrocarbon group is substituted by a fluorine atom. Fluorinated groups in which all of the hydrogen atoms thereof are substituted by fluorine atoms are referred to as perfluorinated groups and are particularly addressed by the term "fluorinated".

In terms of the invention, a group is "substituted with" another group if one of the hydrogen atoms comprised in this group is replaced by another group, wherein the other group is the substituent.

In terms of the invention, the expression "between" with respect to one layer being between two other layers does not exclude the presence of further layers which may be arranged between the one layer and one of the two other layers. In terms of the invention, the expression "in direct contact" with respect to two layers being in direct contact with each other means that no further layer is arranged between those two layers. One layer deposited on the top of another layer is deemed to be in direct contact with this layer.

With respect to the inventive organic semiconducting layer as well as with respect to the inventive compound, the compounds mentioned in the experimental part are most preferred.

The inventive organic electronic device may be an organic electroluminescent device (OLED) an organic photovoltaic device (OPV), a lighting device, or an organic field-effect transistor (OFET). A lighting device may be any of the devices used for illumination, irradiation, signaling, or projection. They are correspondingly classified as illuminating, irradiating, signaling, and projecting devices. A lighting device usually consists of a source of optical radiation, a device that transmits the radiant flux into space in the desired direction, and a housing that joins the parts into a single device and protects the radiation source and light-transmitting system against damage and the effects of the surroundings.

According to another aspect, the organic electroluminescent device according to the present invention may comprise more than one emission layer, preferably two or three emission layers. An OLED comprising more than one emission layer is also described as a tandem OLED or stacked OLED.

The organic electroluminescent device (OLED) may be a bottom- or top-emission device.

Another aspect is directed to a device comprising at least one organic electroluminescent device (OLED).

A device comprising organic light-emitting diodes is for example a display or a lighting panel.

In the present invention, the following defined terms, these definitions shall be applied, unless a different definition is given in the claims or elsewhere in this specification.

In the context of the present specification the term "different" or "differs" in connection with the matrix material means that the matrix material differs in their structural Formula.

The terms "OLED" and "organic light-emitting diode" are simultaneously used and have the same meaning. The term "organic electroluminescent device" as used herein may comprise both organic light emitting diodes as well as organic light emitting transistors (OLETs).

As used herein, "weight percent", "wt.-%", "percent by weight", "% by weight", parts by weight and variations thereof refer to a composition, component, substance or agent as the weight of that component, substance or agent of the respective electron transport layer divided by the total weight of the respective electron transport layer thereof and multiplied by 100. It is under-stood that the total weight percent amount of all components, substances and agents of the respective electron transport layer and electron injection layer are selected such that it does not exceed 100 wt.-%.

As used herein, "volume percent", "vol.-%", "percent by volume", "% by volume", and variations thereof refer to a composition, component, substance or agent as the volume of that component, substance or agent of the respective electron transport layer divided by the total volume of the respective electron transport layer thereof and multiplied by 100. It is understood that the total volume percent amount of all components, substances and agents of the cathode layer are selected such that it does not exceed 100 vol.-%.

All numeric values are herein assumed to be modified by the term "about", whether or not explicitly indicated. As used herein, the term "about" refers to variation in the numerical quantity that can occur. Whether or not modified by the term "about" the claims include equivalents to the quantities.

It should be noted that, as used in this specification and the appended claims, the singular forms "a", "an", and "the" include plural referents unless the content clearly dictates otherwise.

The term "free of", "does not contain", "does not comprise" does not exclude impurities.

Impurities have no technical effect with respect to the object achieved by the present invention.

In the context of the present specification the term "essentially non-emissive" or "non-emissive" means that the contribution of the compound or layer to the visible emission spectrum from the device is less than 10%, preferably less than 5% relative to the visible emission spectrum. The visible emission spectrum is an emission spectrum with a wavelength of about ≥380 nm to about ≤780 nm.

Preferably, the organic semiconducting layer comprising the compound of Formula I is essentially non-emissive or non-emitting.

The operating voltage, also named U, is measured in Volt (V) at 10 milliAmpere per square centimeter (mA/cm2).

The candela per Ampere efficiency, also named cd/A efficiency is measured in candela per ampere at 10 milli-Ampere per square centimeter (mA/cm2).

The external quantum efficiency, also named EQE, is measured in percent (%).

The color space is described by coordinates CIE-x and CIE-y (International Commission on Illumination 1931). For blue emission the CIE-y is of particular importance. A smaller CIE-y denotes a deeper blue color.

The energy levels of the highest occupied molecular orbital, also named HOMO, and of the lowest unoccupied molecular orbital, also named LUMO, are measured in electron volt (eV) against vacuum energy level which is conventionally taken as zero.

The term "OLED", "organic light emitting diode", "organic light emitting device", "organic optoelectronic device" and "organic light-emitting diode" are simultaneously used and have the same meaning.

The term "life-span" and "lifetime" are simultaneously used and have the same meaning.

The anode electrode and cathode electrode may be described as anode electrode/cathode electrode or anode electrode/cathode electrode or anode electrode layer/cathode electrode layer.

Room temperature, also named ambient temperature, is 23° C.

BRIEF DESCRIPTION OF THE DRAWINGS

These and/or other aspects and advantages of the present invention will become apparent and more readily appreciated from the following description of the exemplary embodiments, taken in conjunction with the accompanying drawings, of which.

DETAILED DESCRIPTION

Figure 1:
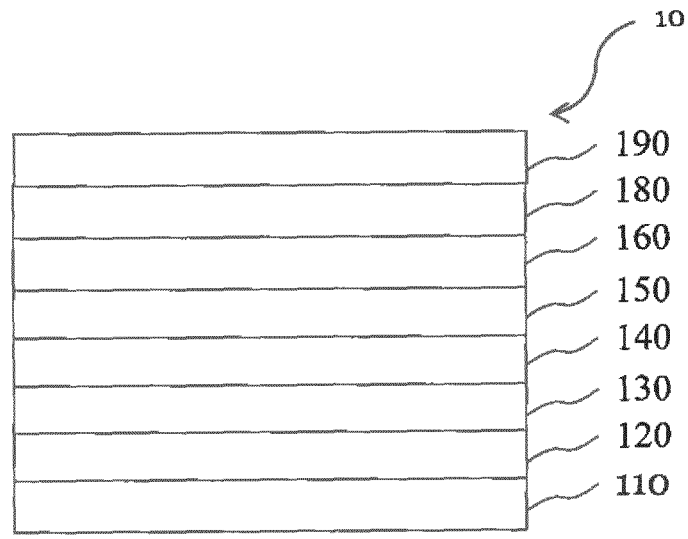
FIG. 1 is a schematic sectional view of an organic light-emitting diode (OLED), according to an exemplary embodiment of the present invention.

Reference will now be made in detail to the exemplary embodiments of the present invention, examples of which are illustrated in the accompanying drawings, wherein like reference numerals refer to the like elements throughout.

The exemplary embodiments are described below, in order to explain the aspects of the present invention, by referring to the figures.

Herein, when a first element is referred to as being formed or disposed "on" or "onto" a second element, the first element can be disposed directly on the second element, or one or more other elements may be disposed there between. When a first element is referred to as being formed or disposed "directly on" or "directly onto" a second element, no other elements are disposed there between.

FIG. 1 is a schematic sectional view of an organic light-emitting diode (OLED) 100, according to an exemplary embodiment of the present invention. The OLED 100 includes a substrate no, an anode 120, a hole injection layer (HIL) 130, a hole transport layer (HTL) 140, an emission layer (EML) 150, an electron transport layer (ETL) 160. The electron transport layer (ETL) 160 is formed on the EML 150. Onto the electron transport layer (ETL) 160, an electron injection layer (EIL) 180 is disposed. The cathode 190 is disposed directly onto the electron injection layer (EIL) 180.

Instead of a single electron transport layer 160, optionally an electron transport layer stack (ETL) can be used.

Figure 2:
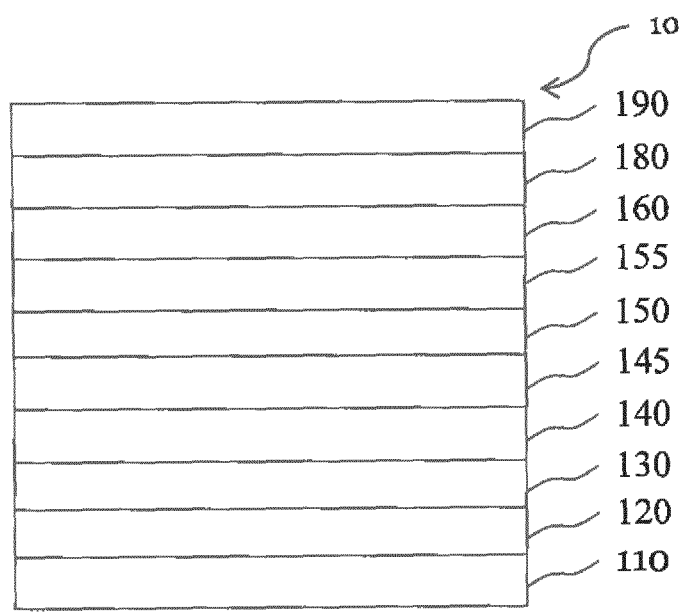
FIG. 2 is a schematic sectional view of an OLED, according to an exemplary embodiment of the present invention.

FIG. 2 is a schematic sectional view of an OLED 100, according to another exemplary embodiment of the present invention. FIG. 2 differs from FIG. 1 in that the OLED 100 of FIG. 2 comprises an electron blocking layer (EBL) 145 and a hole blocking layer (HBL) 155.

Referring to FIG. 2, the OLED 100 includes a substrate 110, an anode 120, a hole injection layer (HIL) 130, a hole transport layer (HTL) 140, an electron blocking layer (EBL) 145, an emission layer (EML) 150, a hole blocking layer (HBL) 155, an electron transport layer (ETL) 160, an electron injection layer (EIL) 180 and a cathode electrode 190.

Preferably, the organic semiconducting layer comprising a composition according to invention or consisting of the composition according to invention may be an EML, an HBL or an ETL.

Figure 3:
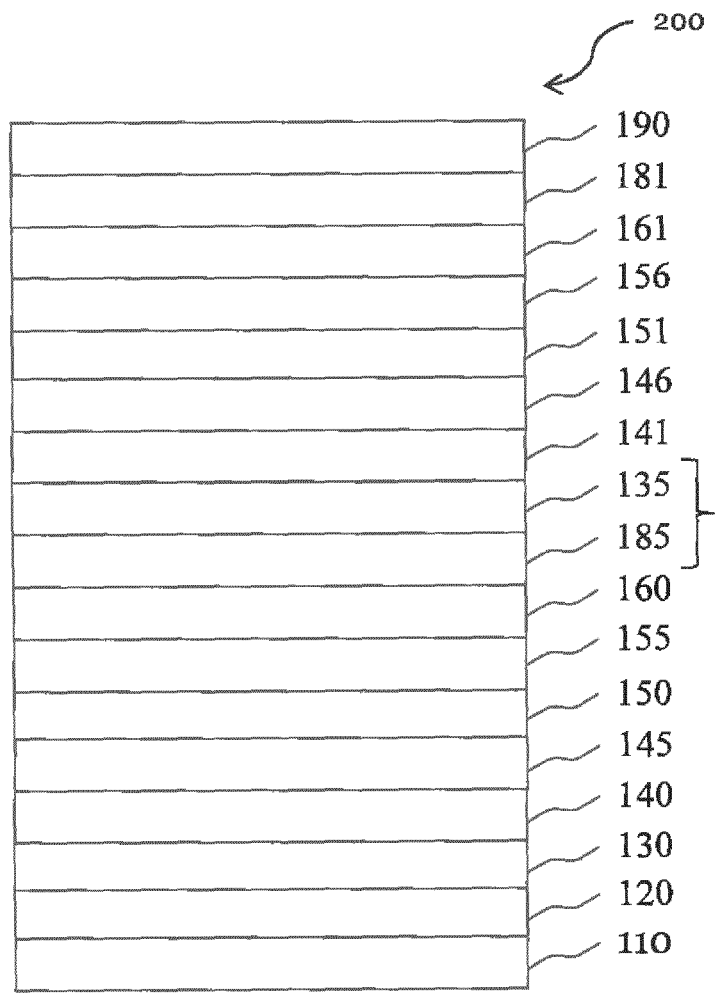
FIG. 3 is a schematic sectional view of a tandem OLED comprising a charge generation layer, according to an exemplary embodiment of the present invention.

FIG. 3 is a schematic sectional view of a tandem OLED 200, according to another exemplary embodiment of the present invention. FIG. 3 differs from FIG. 2 in that the OLED 100 of FIG. 3 further comprises a charge generation layer (CGL) and a second emission layer (151).

Referring to FIG. 3, the OLED 200 includes a substrate 110, an anode 120, a first hole injection layer (HIL) 130, a first hole transport layer (HTL) 140, a first electron blocking layer (EBL) 145, a first emission layer (EML) 150, a first hole blocking layer (HBL) 155, a first electron transport layer (ETL) 160, an n-type charge generation layer (n-type CGL) 185, a hole generating layer (p-type charge generation layer; p-type GCL) 135, a second hole transport layer (HTL) 141, a second electron blocking layer (EBL) 146, a second emission layer (EML) 151, a second hole blocking layer (EBL) 156, a second electron transport layer (ETL) 161, a second electron injection layer (EIL) 181 and a cathode 190.

Preferably, the organic semiconducting layer according to invention may be the first EML, first HBL, first ETL, n-type CGL and/or second EML, second HBL, second ETL.

While not shown in FIG. 1, FIG. 2 and FIG. 3, a sealing layer may further be formed on the cathode electrodes 190, in order to seal the OLEDs 100 and 200. In addition, various other modifications may be applied thereto.

Hereinafter, one or more exemplary embodiments of the present invention will be described in detail with reference to the following examples. However, these examples are not intended to limit the purpose and scope of the one or more exemplary embodiments of the present invention.

Table 1 shows the effect of the invention on results obtained from Device example 1 described in detail in the experimental part below.

TABLE 1

| ETL | Lum (cd/m$^2$) | CIEy | j (mA/cm$^2$) | Voltage (V) | CEff/CIEy at 0.045 (cd/A) | LT97 (h) | LT97 30 mA/cm$^2$ (h) |
|---|---|---|---|---|---|---|---|
| E1:LiQ (50:50) | 942 | 0.047 | 12.5 | 3.94 (102%) | 160 (102%) | 330 (89%) | 85 (92%) |
| B1:LiQ (50:50) | 879 | 0.045 | 12.5 | 3.85 (100%) | 157 (100%) | 353 (100%) | 92 (100%) |
| E1:E2:LiQ (25:25:50) | 858 | 0.044 | 11.7 | 3.77 (98%) | 166 (106%) | 300 (85%) | 77 (84%) |

The invention enabled tuning voltage/efficiency ratio while keeping lifetime in an acceptable range.

EXPERIMENTAL PART

General Methods

Dipole Moment

The dipole moment [$\vec{\mu}$] of a molecule containing N atoms is given by:

$$\vec{\mu} = \sum_i^N q_i \vec{r_1}$$

$$|\vec{\mu}| = \sqrt{\mu_x^2 + \mu_y^2 + \mu_z^2}$$

where $q_1$ and $\vec{r_1}$ are the partial charge and position of atom i in the molecule.

The dipole moment is determined by a semi-empirical molecular orbital method.

The geometries of the molecular structures are optimized using the hybrid functional B3LYP with the 6-31G* basis set in the gas phase as implemented in the program package TURBOMOLE V6.5 (TURBOMOLE GmbH, Litzenhardtstrasse 19, 76135 Karlsruhe, Germany), If more than one conformation is viable, the conformation with the lowest total energy is selected to determine the bond lengths of the molecules.

Calculated HOMO and LUMP

The HOMO and LUMO are calculated with the program package TURBOMOLE V6.5 (TURBOMOLE GmbH, Litzenhardtstrasse 19, 76135 Karlsruhe, Germany). The optimized geometries and the HOMO and LUMO energy levels of the molecular structures are determined by applying the hybrid functional B3LYP with a 6-31G* basis set in the gas phase. If more than one conformation is viable, the conformation with the lowest total energy is selected.

The invention is furthermore illustrated by the following examples which are illustrative only and non-binding.

Supporting Materials for Device Experiments

F1 is

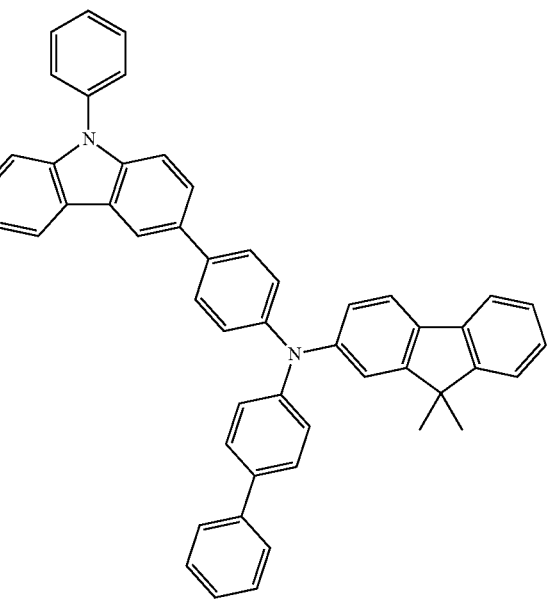

N-([1,1'-biphenyl]-4-yl)-9,9-dimethyl-N-(4-(9-phenyl-9H-carbazol-3-yl)phenyl)-9H-fluoren-2-amine, CAS 1242056-42-3

F2 is

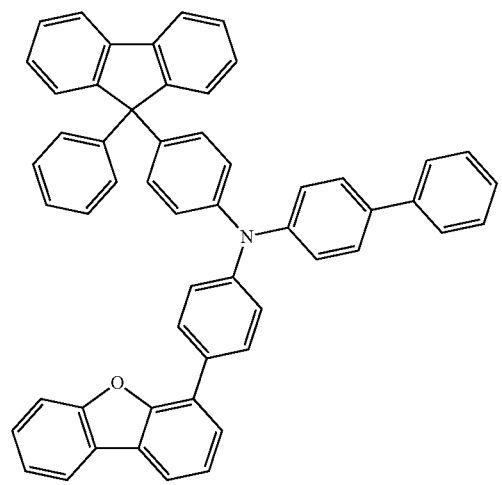 [SMILES: c1ccc(-c2ccc(N(c3ccc(-c4cccc5c4oc4ccccc45)cc3)c3ccc(C4(c5ccccc5)c5ccccc5-c5ccccc54)cc3)cc2)cc1]

23

N-(4-(dibenzo[b,d]furan-4-yl)phenyl)-N-(4-(9-phenyl-9H-fluoren-9-yl)phenyl)-[1,1'-biphenyl]-4-amine, CAS 1824678-59-2

F3 is

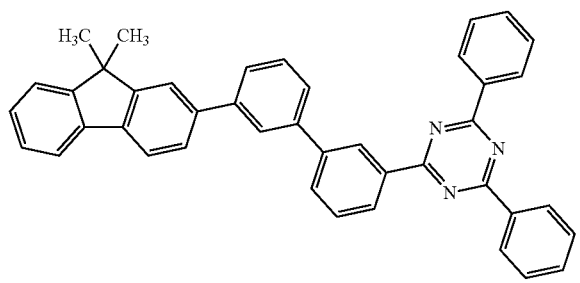 [SMILES: CC1(C)c2ccccc2-c2ccc(-c3cccc(-c4cccc(-c5nc(-c6ccccc6)nc(-c6ccccc6)n5)c4)c3)cc21]

2-(3'-(9,9-dimethyl-9H-fluoren-2-yl)-[1,1'-biphenyl]-3-yl)-4,6-diphenyl-1,3,5-triazine, CAS 1955543-57-3

F4 is

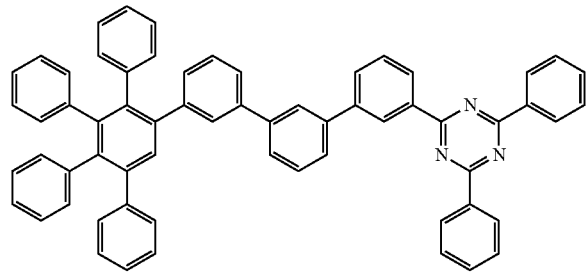 [SMILES: c1ccc(-c2nc(-c3ccccc3)nc(-c3cccc(-c4cccc(-c5cccc(-c6cc(-c7ccccc7)c(-c7ccccc7)c(-c7ccccc7)c6-c6ccccc6)c5)c4)c3)n2)cc1]

2,4-diphenyl-6-(4',5',6'-triphenyl-[1,1':2',1":3",1''':3''',1''''-quinquephenyl]-3'''-yl)-1,3,5-triazine, CAS 2032364-64-8

F5 is

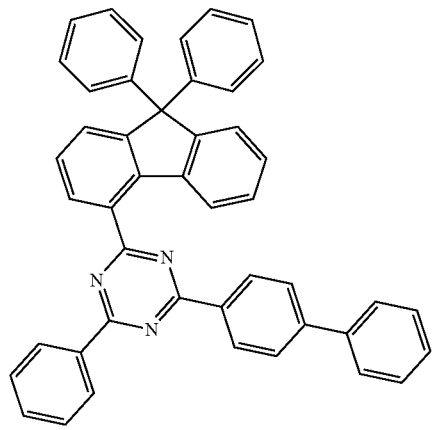 [SMILES: c1ccc(-c2ccc(-c3nc(-c4ccccc4)nc(-c4cccc5c4-c4ccccc4C5(c4ccccc4)c4ccccc4)n3)cc2)cc1]

24

2-([1,1'-biphenyl]-4-yl)-4-(9,9-diphenyl-9H-fluoren-4-yl)-6-phenyl-1,3,5-triazine, CAS 1801992-44-8

F6 is

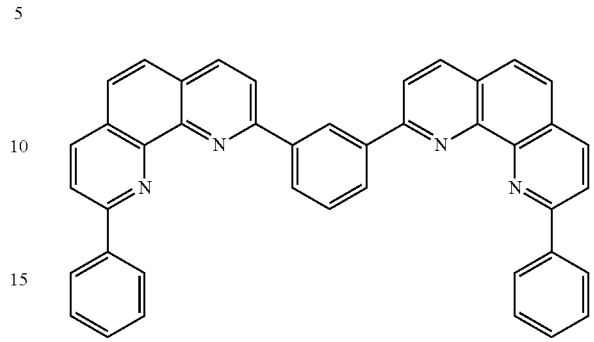

1,3-bis(9-phenyl-1,10-phenanthrolin-2-yl)benzene, CAS 721969-94-4

B1 is

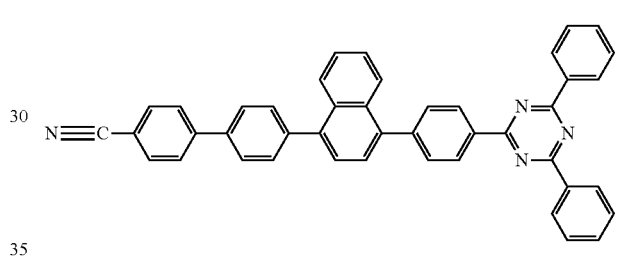

4'-(4-(4-(4,6-diphenyl-1,3,5-triazin-2-yl)phenyl)naphthalen-1-yl)-[1,1'-biphenyl]-4-carbonitrile, CAS 2032421-37-5

LiQ is lithium 8-hydroxyquinolinolate, H09 is a commercial blue emitter host and BD200 is a commercial blue emitter, both supplied by SFC, Korea;

PD2 is

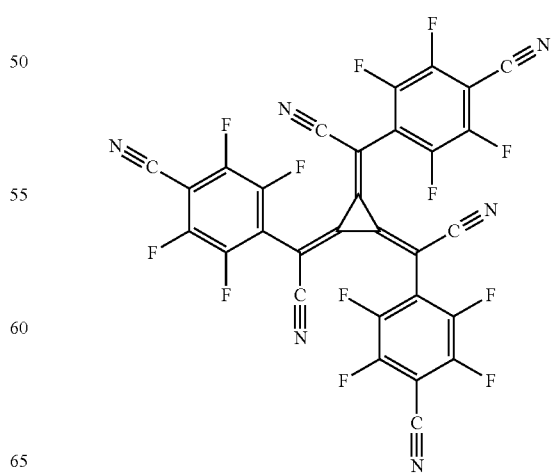

4,4',4'-((1E,1'E,1"E)-cyclopropane-1,2,3-triyldenetris(cyanomethanylylidene))tris(2,3,5,6-tetrafluorobenzonitrile), CAS 1224447-88-4

Synthesis of the Compound E2

2-([1,1'-biphenyl]-3-yl)-4-phenyl-6-(3-(10-phenylanthracen-9-yl)phenyl)-1,3,5-triazine (E2)

In a 500 mL 3-necked flask, compound A (CAS number 1689576-03-1, 15 g, 43.6 mmol, 1 eq.), boronic acid B (CAS number 1023674-81-8, 17.9 g, 49.0 mmol, 1.1 eq.) and potassium carbonate (12.0 g, 55.9 mmol, 2 eq.) together with THF (350 mL) and distilled water (87 mL), The yellow suspension was degassed by bubbling N2 through for 60 minutes. Then Pd(dppf)Cl2 (0.15 g, 0.21 mmol) was added under nitrogen counter flow. The reaction was then heated 19 h at 75° C. (bath temperature) under nitrogen. After cooling to rt and evaporation of the solvent, residue was extracted with 4 L DCM/Chloroform and the organic layer washed in portions with in total 7.5 L of water until pH neutral. After filtering over Florisil layer, the organic layer was evaporated and the residue treated by 200 mL hexane. Precipitate was filtered and dried under high vacuum two times at 120° C.

Obtained 20-3 g (73% theory) MS [M+H]+ 638.

Synthesis of the Compound E3

(3-(10-(3-(2,6-diphenylpyrimidin-4-yl)phenyl)anthracen-9-yl)phenyl)dimethylphosphine oxide (E3)

A 3-neck round bottom flask was flushed with nitrogen and charged with 2,4-diphenyl-6-(3-(4,4,5,5-tetramethyl-1,3,2-dioxaborolan-2-yl)phenyl)pyrimidine (26.26 g, 60.46 mmol, 1 eq), (3-(10-bromoanthracen-9-yl)phenyl)dimethylphosphine oxide (25.98 g, 63.48 mmol, 1.05 eq), potassium carbonate (16.71 g, 120.9 mmol, 2 eq), tetrahydrofuran (240 mL) and water (60 mL). The reaction mixture was degassed with N2 for 30 min and the catalyst [1,1'-bis(diphenylphosphino)ferrocene]dichloropalladium(II) (0.22 g, 0.30 mmol, 0.005 eq) was added. The mixture was stirred for 3 d at 75° C.

The reaction mixture was allowed to cool to room temperature and the product was collected by filtration. The solid material was washed with water until it was neutral, washed with 3×150 mL methanol, then dried at 50° C. under vacuum for two hours. The raw product was dissolved in DCM, filtered over silica gel and the solvent was removed. The product was recrystallized from chlorobenzene and washed with hexane, then dried at 100° C. under vacuum overnight. 61% yield, ESI-MS 637 (M+H).

Synthesis of the Compound E4

2-([1,1'-biphenyl]-3-yl)-4-phenyl-6-(3-(3,5,6-triphenylpyrazin-2-yl)phenyl)-1,3,5-triazine (E4)

A 3-neck round bottom flask was flushed with nitrogen and charged with 2,3,5-triphenyl-6-(3-(4,4,5,5-tetramethyl-1,3,2-dioxaborolan-2-yl)phenyl)pyrazine (38.2 g, 75 mmol, 1 eq), 2-([1,1'-biphenyl]-3-yl)-4-chloro-6-phenyl-1,3,5-triazine (25.79 g, 75 mmol, 1 eq), potassium carbonate (20.73 g, 150 mmol, 2 eq), tetrahydrofuran (300 mL) and water (75 mL). The reaction mixture was degassed under vacuum and reflux and the catalyst tetrakis(triphenylphosphin)palladium (0) (1.73 g, 1.5 mmol, 0.02 eq) was added. The mixture was stirred for 19 h at 65° C.

The reaction mixture was cooled to 10° C. and the product was collected by filtration. The solid material was washed with tetrahydrofuran and water, then dried at 50° C. under vacuum for three days. The raw product was dissolved in chloroform, filtered over silica gel and the solvent was reduced to 100 mL. The product was precipitated overnight by stirring with 200 mL cyclohexane, then collected by filtration and dried. The solid was dissolved in 250 mL chloroform and re-precipitated with 200 mL methyl tert-butyl ether overnight.

The product was obtained through filtration, then dried at 60° C. under vacuum overnight. 74% yield, ESI-MS 692 (M+H).

Synthesis of Compound E6

2-(3-(2,6-dimethylpyridin-3-yl)phenyl)-4-(2',6'-diphenyl-[1,1':4',1"-terphenyl]-4-yl)-6-phenyl-1,3,5-triazine (E6)

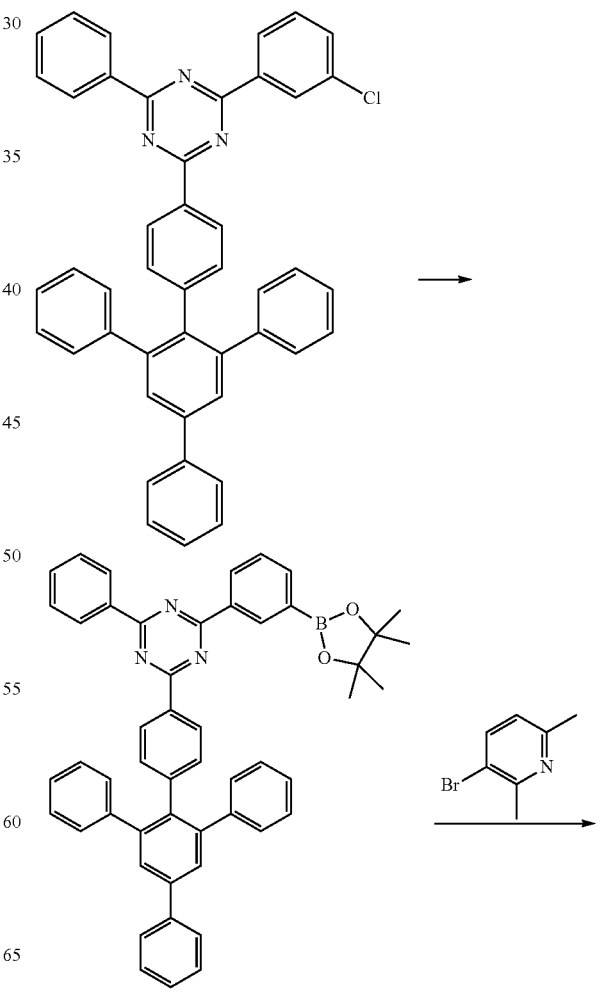

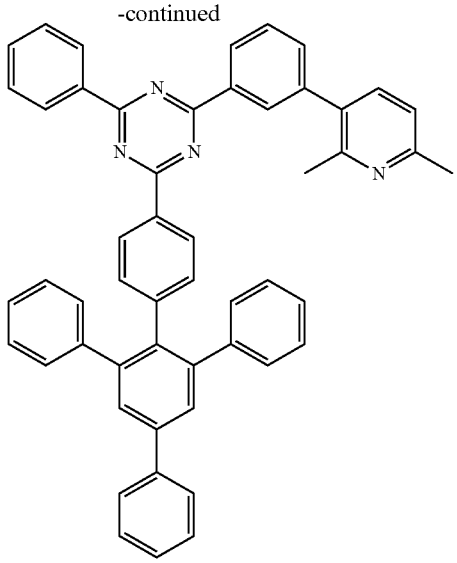

A) 2-(2',6'-diphenyl-[1,1':4',1''-terphenyl]-4-yl)-4-phenyl-6-(3-(4,4,5,5-tetramethyl-1,3,2-dioxaborolan-2-yl)phenyl)-1,3,5-triazine A flask was flushed with nitrogen and charged with 2-(3-chlorophenyl)-4-(2',6'-diphenyl-[1,1':4',1''-terphenyl]-4-yl)-6-phenyl-1,3,5-triazine (24.4 g, 39.2 mmol), 4,4,4',4',5,5,5',5'-octamethyl-2,2'-bi(1,3,2-dioxaborolane) (12.9 g, 51.0 mmol), KOAc (11.5 g, 117.6 mmol), 2-Dicyclohexylphosphino-2',4',6'-triisopropylbiphenyl (934 mg, 2.0 mmol) and tris(dibenzylideneacetone)dipalladium(0) (897 mg, 1 mmol). Anhydrous dioxane (200 mL) was added and the reaction mixture was heated to 100° C. under a nitrogen atmosphere overnight. After cooling down to room temperature, the resulting precipitate was isolated by suction filtration and washed with water (600 mL) and methanol (200 mL). The crude product was then dissolved in dichloromethane and filtered through a pad of Florisil. After rinsing with additional dichloromethane (2.5 L mL), the filtrate was concentrated, under reduced pressure. The resulting precipitate was isolated by suction filtration and washed with n-hexane (100 mL) to yield 24.6 g (36%) of the intermediate.

B) 2-(3-(2,6-dimethylpyridin-3-yl)phenyl)-4-(2',6'-diphenyl-[1,1':4',1''-terphenyl]-4-yl)-6-phenyl-1,3,5-triazine (E6)

Next a flask was flushed with nitrogen and charged with 2-(2',6'-diphenyl-[1,1':4',1''-terphenyl]-4-yl)-4-phenyl-6-(3'-(4,4,5,5-tetramethyl-1,3,2-dioxaborolan-2-yl)phenyl)-1,3,5-triazine (12.2 g, 16.3 mmol), 3-bromo-2,6-dimethylpyridine (2.6 mL, 19.6 mmol), $K_3PO_4$ (8.7 g, 40.8 mmol) and chloro(crotyl)(2-dicyclohexylphosphino-2',6'-dimethoxybiphenyl)palladium(II) (198 mg, 0.33 mmol). A mixture of deaerated dioxane and water (4:1, 100 mL) was added and the reaction mixture was heated to 50° C. under a nitrogen atmosphere overnight. After cooling down to room temperature, the resulting precipitate was isolated by suction filtration and washed with water (1.0 L) and Methanol (100 mL). The crude product was dissolved in dichloromethane and washed with an aqueous solution of NADTC (3%, 150 mL), and then with water (2×200 mL). The organic phase was dried over $Na_aSO_4$ and filtered through a pad of silicagel.

After rinsing with additional dichloromethane (2.0 L), and dichloromethane/methanol (98/2, 1.5 L), the filtrate was concentrated under reduced pressure. The resulting precipitate was isolated by suction filtration to yield 6.4 g compound 1 after drying. Final purification was achieved by sublimation. ESI-MS: m/z=719.2 ([M+H]$^+$).

Device Preparation

All inventive layers used in device examples were prepared by conventional vacuum thermal evaporation (VTE) procedure, wherein the first organic compound has been vaporized from a first vaporization source, the second organic compound from a second vaporization source and the dopant, if present, from a third vaporization source, and the compounds were co-deposited on a solid support.

Device Example 1

Top Emitting Blue OLED Comprising the First and Second Organic Compound in a n-Doped Electron Transport Layer Device structure is shown in Table 2

TABLE 2

| layer | Material | d [nm] |
|---|---|---|
| Anode | Ag | 100 |
| HIL | $F_1$:$PD_2$ (92:8 v/v) | 10 |
| HTL | $F_1$ | 118 |
| EBL | $F_2$ | 5 |
| EML | $H_{09}$:$BD_{200}$ (97:3 v/v) | 20 |
| HBL | $F_3$ | 5 |
| ETL | $E_1$LiQ (50:50 v/v) $E_1$:$E_2$:LiQ (25:25:50 v/v) $B_1$:LiQ (50:50 v/v) | 31 |
| EIL | Yb | 2 |
| Cathode | Ag:Mg (90:10) | 13 |
| Cap | $F_1$ | 70 |

Device Example 2

Top Emitting Blue OLED Comprising the First and Second Organic Compound in an Undoped Electron Transport Layer Device structure is shown in Table 3

TABLE 3

| layer | Material | d [nm] |
|---|---|---|
| Anode | Ag | 100 |
| HIL | $F_1$:$PD_2$ (92:8 v/v) | 10 |
| HTL | $F_1$ | 118 |
| EBL | $F_2$ | 5 |
| EML | $H_{09}$:$BD_{200}$ (97:3 v/v) | 20 |
| HBL | $F_4$ | 5 |
| ETL | $E_1$LiQ (50:50 v/v) $E_1$:$E_2$ (30:70 v/v) | 31 |
| EIL | Yb | 2 |
| Cathode | Ag:Mg (90:10) | 13 |
| Cap | $F_1$ | 70 |

Table 4 shows the results of this experiment

TABLE 4

| ETL | j (mA/cm$^2$) | Voltage (V) | EQE (%) |
|---|---|---|---|
| E1:LiQ (50:50) | 10 | 3.5 | 15.5 |

TABLE 4-continued

| ETL | j (mA/cm$^2$) | Voltage (V) | EQE (%) |
|---|---|---|---|
| E1:E2 (30:70) | 10 | 3.5 | 15.4 |

EQE stands for external quantum efficiency.

The experiment shows that the layer according to invention, consisting only of the first organic compound and of the second organic compound, enables equally good electron injection (from state-of-art cathodes) like n-doped electron transport layers known in the art.

Device Example 3

Tandem OLED Comprising the First and Second Organic Compound in an Undoped Electron Transport Layer Further comparison of inventive layers comprising the first and second organic compound with state-of-art layer made of compound F5 and LiQ in weight ratio 50:50 was made in a model tandem. OLED, wherein the tested electron transport layer was arranged adjacent to and in direct contact with a n-doped charge generation layer made of compound F6 and metallic lithium in weight ratio 98:2. Table 5 shows the results of this experiment.

TABLE 5

| ETL | Voltage (V) | Ceff (cd/A) | LT (h) | dV (V) |
|---|---|---|---|---|
| F5:LiQ (50:50) | 9.43 | 26.4 | 52 | 0.440 |
| E1:E2 (30:70) | 9.58 | 24.8 | 69 | 0.135 |
| E3:E2 (30:70) | 9.53 | 25.4 | 62 | 0.164 |
| E1:E6 (30:70) | 9.51 | 25.4 | 66 | 0.127 |
| E3:E6 (30:70) | 9.44 | 25.5 | 60 | 0.133 |
| E1:E4 (30:70) | 9.75 | 24.4 | 73 | 0.148 |
| E3:E4 (30:70) | 9.56 | 25.1 | 64 | 0.138 |

Voltage V and currenty efficiency Ceff are given for current density 10 mA/cm$^2$, lifetime LT (defined as time necessary for luminance decrease to 97% of its initial value) and voltage rise dV (defined as change in operational voltage after 400 h device operation) are given for current density 30 mA/cm$^2$.

The results show that at a comparable performance, the inventive layer significantly improves device stability.

The features disclosed in the foregoing description and in the dependent claims may, both separately and in any combination thereof, be material for realizing the aspects of the disclosure made in the independent claims, in diverse forms thereof.

The invention claimed is:

1. An organic electroluminescent device comprising an anode, a cathode, at least one emission layer and an organic semiconducting layer;
   wherein the organic semiconducting layer is arranged between the at least one emission layer and the cathode;
   wherein the organic semiconducting layer comprises:
   a) a first organic compound comprising a first $C_{10}$ to $C_{42}$ arene structural moiety and/or a first $C_2$ to $C_{42}$ heteroarene structural moiety, wherein
      i) the dipole moment of the first organic compound, computed by the TURBOMOLE V6.5 program package using hybrid functional B3LYP and Gaussian 6-31G* basis set, is from 0 to 2.5 Debye; and
      ii) the LUMO energy level of the first organic compound in the absolute scale taking vacuum energy level as zero, computed by the TURBOMOLE V6.5 program package using hybrid functional B3LYP and Gaussian 6-31G* basis set, is in the range from −1.7 eV to −2.1 eV; and
   b) a second organic compound comprising a second $C_{10}$ to $C_{42}$ arene structural moiety and/or a second $C_2$ to $C_{42}$ heteroarene structural moiety and in addition at least one polar group selected from phosphine oxide and phosphine sulfide, wherein
      iii) the dipole moment of the second organic compound, computed by the TURBOMOLE V6.5 program package using hybrid functional B3LYP and Gaussian 6-31G* basis set, is from 1.5 to 10 Debye; and
      iv) the LUMO energy level of the second organic compound in the absolute scale taking vacuum energy level as zero is less than 0.25 eV higher or lower than the LUMO energy level of the first organic compound;
   wherein it is provided that the first organic compound and the second organic compound are different from each other.

2. The organic electroluminescent device according to claim 1, wherein the first organic compound and the second organic compound only comprise atoms selected from the group consisting of C, H, B, Si, Ge, O, N, P, S, F and I.

3. The organic electroluminescent device according to claim 1, wherein the organic semiconducting layer further comprises an electrical n-dopant.

4. The organic electroluminescent device according to claim 3, wherein the n-dopant is a metal salt comprising at least one metal cation and at least one anion.

5. The organic electroluminescent device according to claim 4, wherein the metal cation of the metal salt is selected from the group consisting of alkali metals, alkaline earth metals, and rare earth metals.

6. The organic electroluminescent device according to claim 4, wherein the anion of the metal salt is selected from the group consisting of quinolinolate, phosphine oxide phenolate and borate.

7. The organic electroluminescent device according to claim 4, wherein the metal cation of the metal salt is selected from the group consisting of Li, Na, K, Rb, Cs, Mg, Ca, Sr, and Ba.

8. The organic electroluminescent device according to claim 1, wherein the weight ratio of the first organic compound to the second organic compound is from 99:1 to 1:99.

9. The organic electroluminescent device according to claim 1, wherein the molar weight of the first organic compound and the second organic compound is, respectively, from 300 to 3000 g/mol.

10. The organic electroluminescent device according to claim 1, wherein, in the second organic compound
    a) the polar group is phosphine oxide; and/or
    b) the $C_{10}$ to $C_{42}$ arene structural moiety and/or the $C_2$ to $C_{42}$ heteroarene structural moiety comprises at least two fused aromatic rings.

11. The organic electroluminescent device according to claim 10, wherein the $C_{10}$ to $C_{42}$ arene structural moiety and/or the $C_2$ to $C_{42}$ heteroarene structural moiety comprises at least three fused aromatic rings.

12. The organic electroluminescent device according to claim 10, wherein the $C_{10}$ to $C_{42}$ arene structural moiety and/or the $C_2$ to $C_{42}$ heteroarene structural moiety comprises at least four fused aromatic rings.

13. The organic electroluminescent device according to claim 1, wherein the $C_{10}$ to $C_{42}$ arene structural moiety and/or the $C_2$ to $C_{42}$ heteroarene structural moiety comprised in the first organic compound comprises at least two fused aromatic rings.

14. The organic electroluminescent device according to claim 13, wherein the $C_{10}$ to $C_{42}$ arene structural moiety and/or the $C_2$ to $C_{42}$ heteroarene structural moiety comprised in the first organic compound comprises at least three fused aromatic rings.

15. The organic electroluminescent device according to claim 13, wherein the $C_{10}$ to $C_{42}$ arene structural moiety and/or the $C_2$ to $C_{42}$ heteroarene structural moiety comprised in the first organic compound comprises at least four fused aromatic rings.

16. The organic electroluminescent device according to claim 1, wherein the weight ratio of the first organic compound to the second organic compound is from 19:1 to 1:19.

17. The organic electroluminescent device according to claim 1, wherein the weight ratio of the first organic compound to the second organic compound is from 2:3 to 3:2.

18. The organic electroluminescent device according to claim 1, wherein the molar weight of the first organic compound and the second organic compound is, respectively, from 450 to 1500 g/mol.

19. The organic electroluminescent device according to claim 1, wherein the molar weight of the first organic compound and the second organic compound is, respectively, from 500 to 1000 g/mol.

20. A compound having formula E3

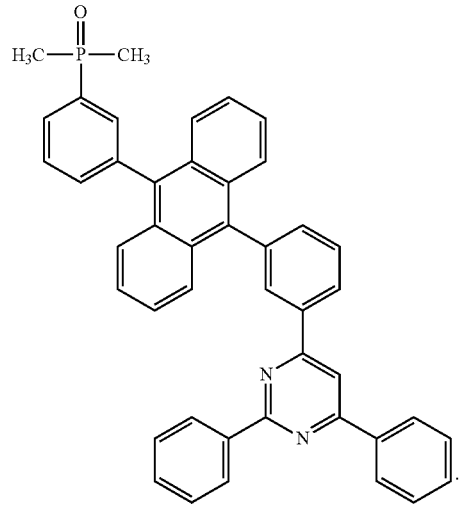

* * * * *